US009177983B2

(12) United States Patent
Kuang et al.

(10) Patent No.: US 9,177,983 B2
(45) Date of Patent: Nov. 3, 2015

(54) IMAGE SENSOR WITH OPTICAL FILTERS HAVING ALTERNATING POLARIZATION FOR 3D IMAGING

(75) Inventors: Jiangtao Kuang, Sunnyvale, CA (US); Donghui Wu, Sunnyvale, CA (US); Tiejun Dai, Santa Clara, CA (US); Jizhang Shan, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 473 days.

(21) Appl. No.: 13/356,333

(22) Filed: Jan. 23, 2012

(65) Prior Publication Data

US 2013/0188023 A1 Jul. 25, 2013

(51) Int. Cl.
*H04N 13/02* (2006.01)
*H01L 27/146* (2006.01)
*H04N 5/369* (2011.01)

(52) U.S. Cl.
CPC .... *H01L 27/14621* (2013.01); *H01L 27/14627* (2013.01); *H04N 5/3696* (2013.01); *H04N 13/0207* (2013.01); *H04N 13/0217* (2013.01); *H04N 13/0257* (2013.01)

(58) Field of Classification Search
CPC .............. H01L 27/14621; H01L 27/14627; H04N 5/3696; H04N 13/0217; H04N 13/0207; H04N 13/0257
USPC ........................................................ 348/49
See application file for complete search history.

(56) References Cited

U.S. PATENT DOCUMENTS

| | | | |
|---|---|---|---|
| 5,727,239 A | 3/1998 | Hankawa et al. | |
| 5,835,133 A | 11/1998 | Moreton et al. | |
| 5,877,040 A * | 3/1999 | Park et al. | 438/70 |
| 6,108,130 A | 8/2000 | Raj | |
| 6,395,576 B1 * | 5/2002 | Chang et al. | 438/70 |
| 6,545,741 B2 | 4/2003 | Meltzer | |
| 7,154,527 B1 * | 12/2006 | Goldstein et al. | 348/45 |
| 2004/0070767 A1 * | 4/2004 | Tobiason et al. | 356/495 |
| 2004/0246352 A1 * | 12/2004 | Suzuki | 348/272 |

(Continued)

FOREIGN PATENT DOCUMENTS

| | | |
|---|---|---|
| JP | 2001-016611 A | 1/2001 |
| TW | 2011-43365 A | 12/2011 |
| WO | WO 2010/144866 A2 | 12/2010 |

OTHER PUBLICATIONS

Ohta, Jun, "Smart CMOS image sensors and applications," CRC Press Taylor & Francis Group, Boca Raton, 2007, pp. 80-83.

(Continued)

*Primary Examiner* — Richard Torrente
*Assistant Examiner* — Joseph Suh
(74) *Attorney, Agent, or Firm* — Blakely Sokoloff Taylor & Zafman LLP

(57) ABSTRACT

An image sensor for three-dimensional ("3D") imaging includes a first, a second, and a third pixel unit, where the second pixel unit is disposed between the first and third pixel units. Optical filters included in the pixel units are disposed on a light incident side of the image sensor to filter polarization-encoded light having a first polarization and a second polarization to photosensing regions of the pixel units. The first pixel unit includes a first optical filter having the first polarization, the second pixel unit includes a second optical filter having the second polarization, and the third pixel unit includes a third optical filter having the first polarization.

18 Claims, 11 Drawing Sheets

(56) References Cited

U.S. PATENT DOCUMENTS

| | | |
|---|---|---|
| 2006/0283952 A1* | 12/2006 | Wang ................ 235/462.01 |
| 2008/0231946 A1* | 9/2008 | Scott et al. ................ 359/350 |
| 2009/0272880 A1 | 11/2009 | Stanton et al. |
| 2010/0200738 A1* | 8/2010 | Yamashita ............ 250/227.11 |
| 2010/0282945 A1* | 11/2010 | Yokogawa ............. 250/208.1 |
| 2010/0321476 A1* | 12/2010 | Martinez et al. ............ 348/49 |
| 2011/0266441 A1* | 11/2011 | Fagan et al. ................ 250/332 |
| 2011/0316983 A1* | 12/2011 | Hiramoto et al. ............ 348/49 |
| 2012/0075513 A1* | 3/2012 | Chipman et al. ............ 348/302 |
| 2012/0307018 A1* | 12/2012 | Damstra et al. ............ 348/49 |

OTHER PUBLICATIONS

TW 102102370—First Taiwan Office Action with English Translation, issued Jan. 28, 2015, 18 pages.

CN 201310025756.7—First Chinese Office Action with English Translation, issued Feb. 6, 2015, 21 pages.

* cited by examiner (a)

(b)

(c)

(d)

(e)

(f)

US 9,177,983 B2

IMAGE SENSOR WITH OPTICAL FILTERS HAVING ALTERNATING POLARIZATION FOR 3D IMAGING

TECHNICAL FIELD

This disclosure relates generally to image sensors, and in particular but not exclusively, relates to 3D image sensors.

BACKGROUND INFORMATION

Recently, three-dimensional (3D) movies are played in cinemas and receive a great deal of attention from public. 3D TVs and displays are also available for home use. 3D movies can be played using a 3D DVD player and thus a 3D movie can be watched at home. A 3D display may also be known as a stereoscopic display.

Displaying a 3D image is essentially conducted by allowing the left eye to see a left view only and the right eye to see a right view only. The difference between the left and right views creates a parallax such that the viewer feels as he is seeing a 3D object. To let the left eye see the left view only and the right eye see the right view only both views must be isolated from each other. The left and right views provided by a display may be encoded in time, i.e., alternately displayed. A pair of goggle shutters may be turned on and off in a synchronized fashion, such that by wearing the goggle the left eye will see the left view only and the right eye will see the right view only. The left and right views may also be polarization-encoded. For example, the left view may horizontally polarized while the right view is vertically polarized. A pair of polarized goggles then may have a horizontal polarizer for the left eye and a vertical polarizer for the right eye. By wearing the polarized goggle, the left and right eyes will see their respective views only.

Some conventional 3D imaging systems use two separate cameras to capture a 3D image—one to record the left view and another to record the right view. Other conventional systems may record the left and right views using a single camera having two individual image sensors. Further conventional systems may include a single camera that uses a single image sensor, where the left and right views are recorded in left and right halves of the image sensor, respectively.

In more recent conventional systems, a single camera that uses a single image sensor may be implemented where the left and right views are separated using a lenticular-lens or micro-lens array such that the left and right images are interleaved onto the image sensor. However, the interleaving using a lenticular-lens or micro-lens array may increase pixel crosstalk and may also introduce crosstalk between the captured left and right images.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an Image Sensor with Optical Filters having Alternating Polarization for 3D Imaging are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
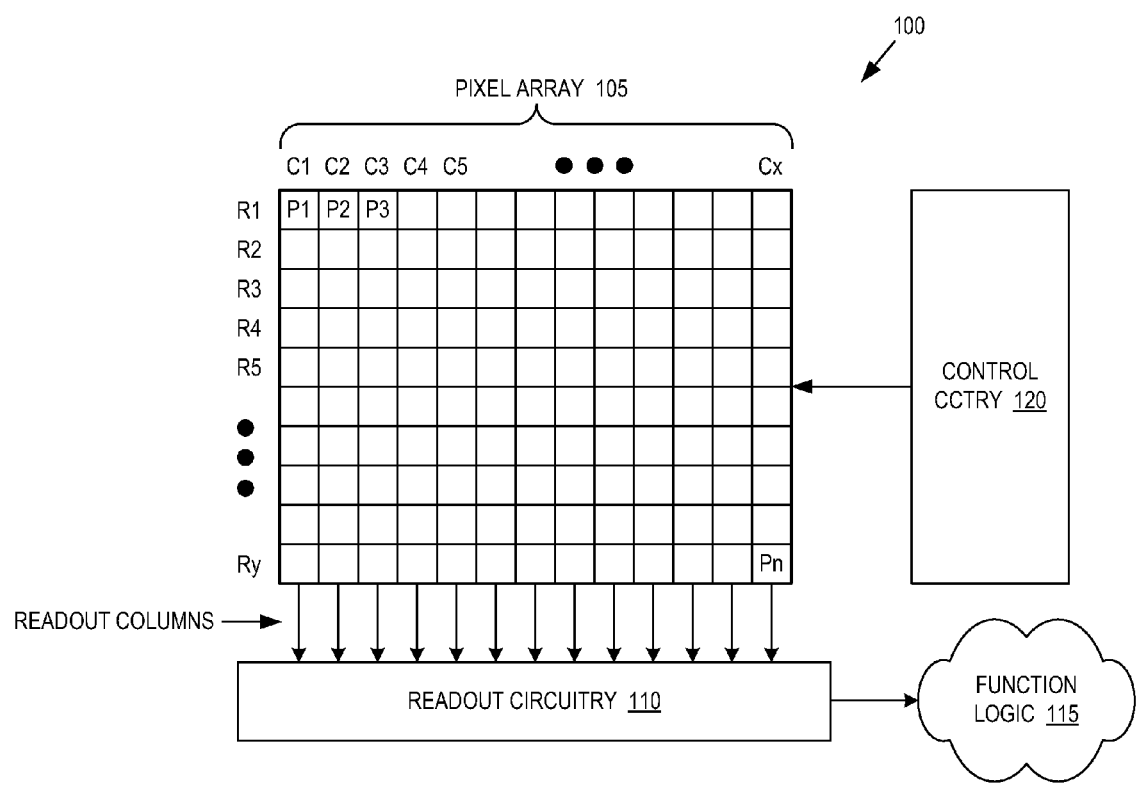
FIG. 1 is an exemplary block diagram illustrating an image sensor, in accordance with an embodiment of the invention.

FIG. 1 is an exemplary block diagram illustrating an image sensor 100, in accordance with an embodiment of the invention. The illustrated embodiment of image sensor 100 includes an active area (i.e., pixel array 105), readout circuitry 110, function logic 115, and control circuitry 120.

For example, pixel array 105 is a two-dimensional array of backside or frontside illuminated imaging pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render an image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristics of pixel array 105. For example, control circuitry 120 may generate a shutter signal for controlling image acquisition.

Figure 2:
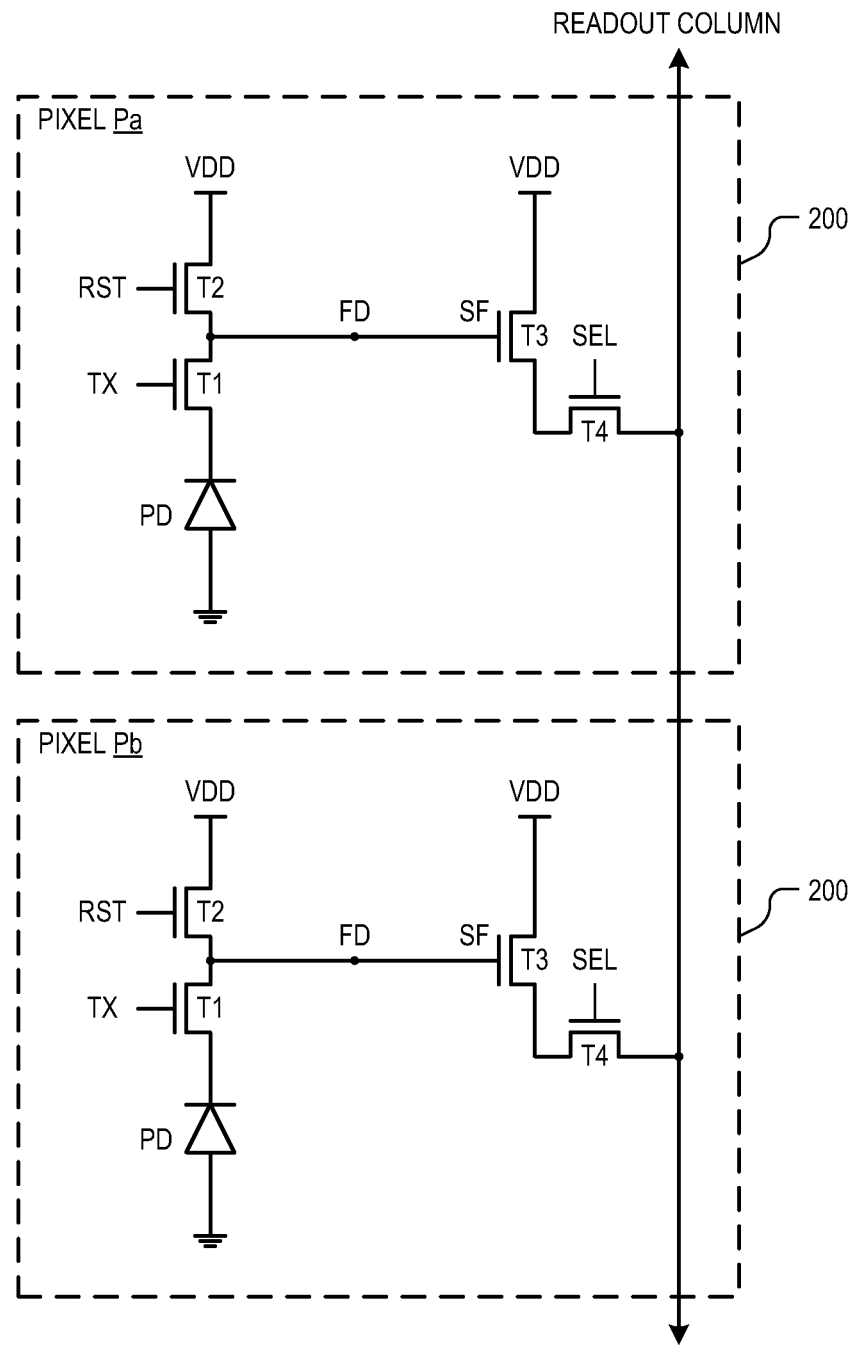
FIG. 2 is an exemplary circuit diagram illustrating pixel circuitry of two four-transistor ("4T") pixels within an image sensor, in accordance with an embodiment of the invention.

FIG. 2 is an exemplary circuit diagram illustrating pixel circuitry of two four-transistor ("4T") pixels within an image sensor, in accordance with an embodiment of the invention. Pixel circuitry 200 is one possible pixel circuitry architecture for implementing each pixel within pixel array 105 of FIG. 1. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 2, pixels Pa and Pb are arranged in two rows and one column. The illustrated embodiment of each pixel circuitry 200 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of pixel circuitry 200 to the readout column line under control of a select signal SEL. In one embodiment, the TX signal, the RST signal, and the SEL signal are generated by control circuitry 120. The TX signal, the RST signal, the SEL signal, VDD, and ground may be routed in pixel circuitry 100 by way of metal interconnect layers included in the image sensor.

Figure 3:
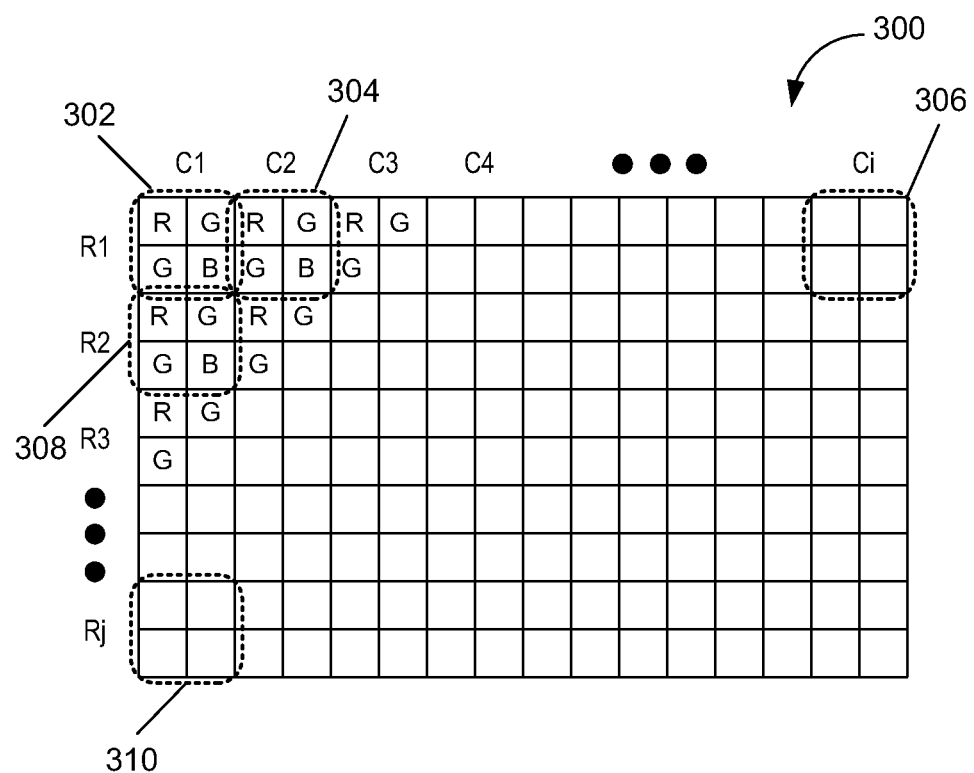
FIG. 3 is a diagram of an array of pixel units of an image sensor, in accordance with an embodiment of the invention.

FIG. 3 is a diagram of an array 300 of pixel units (e.g., pixel units 302, 304, 306, 308, and 310) of an image sensor, in accordance with an embodiment of the invention. In one aspect, a "pixel unit" is a grouping of one or more imaging pixels, such as the imaging pixels of pixel array 105 in image sensor 100 in FIG. 1. Several color imaging pixels may be included in the active area of an image sensor, such as red (R), green (G), and blue (B) imaging pixels. For example, pixel unit 302 is illustrated as including four color imaging pixels (e.g., one R pixel, one B pixel, and two G pixels) arranged into a Bayer pattern. Other color imaging pixels and other color patterns, not shown, may be implemented into the pixel unit in accordance with the teachings of the present disclosure.

As illustrated, each pixel unit of array 300 is arranged into a row (e.g., rows R1 to Rj) and a column (e.g., column C1 to Ci). Thus, an image sensor in accordance with the teachings herein may include both an array of imaging pixels and an array of pixel units, where the array of pixel units is just an organized grouping of the imaging pixels in the pixel array.

Embodiments of the present invention may be configured to receive polarization-encoded light that contains information for imaging a three-dimensional (3D) image. For example, light incident on the image sensor may include light polarized to a first polarization corresponding to a first view of a 3D object and may also include light polarized to a second polarization corresponding to a second view of the 3D object. In one embodiment, the first view is a "left view" and the second view is a "right view" to allow for the creation of a parallax by the image sensor. Thus, image sensors in accordance with the teachings given herein may include optical filters having alternating polarizations to filter the polarization-encoded light to photosensing regions of the pixel units.

Figure 4:
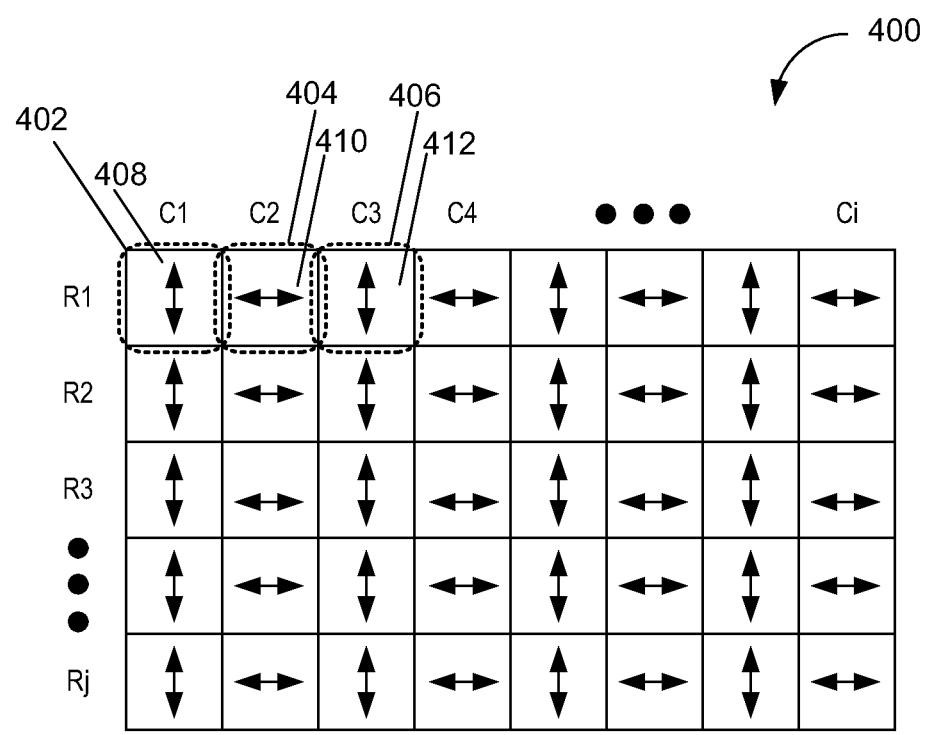
FIG. 4 is a diagram of an array of pixel units having optical filters with alternating polarizations each adjacent column, in accordance with an embodiment of the invention.

For example, FIG. 4 is a diagram of an array 400 of pixel units (e.g., pixel units 402, 404, and 406) having respective optical filters (e.g., 408, 410, and 412) with alternating polarizations each adjacent column, in accordance with an embodiment of the invention. Array 400 is one possible implementation of array 300 of FIG. 3.

The optical filters may cover an entire pixel unit (e.g., all four imaging pixels of a Bayer pattern, as shown in FIG. 3). In the illustrated example, the polarizations of the optical filters alternate each adjacent column. Thus, all optical filters in column C1 may have the same polarization, such as a vertical polarization. Similarly, all optical filters in column C3 may have the same polarization as in column C1. However, the optical filters of column C2 may have a different polarization than those in column C1 and C3. In one embodiment, the polarization of the optical filters in column C2 is orthogonal to that of the optical filters in both columns C1 and C3.

By way of example, FIG. 4 illustrates pixel units 402, 404 and 406 as all disposed in the same row R1 of array 400. Pixel unit 402 adjoins a left-side of pixel unit 404 and pixel unit 406 adjoins a right-side of pixel unit 404, such that pixel unit 404 is between pixel units 402 and 406. Optical filters 408 and 412, included in pixel units 402 and 406 respectively, both include the same polarization, such as vertical polarization. However, optical filter 410 included in the in-between pixel unit 404 has a polarization that is different than that of the optical filters to the right and left. In one embodiment, the polarization of optical filter 410 is orthogonal to that of optical filters 408 and 412.

Although FIG. 4 illustrates vertical polarization coinciding with the direction of the column and horizontal polarization generally coinciding with the direction of the rows, it is appreciated that vertical polarization does not have to be parallel to the column and horizontal polarization does not have to be perpendicular to the column. Thus, the terms of vertical and horizontal polarizations may merely be used for simplicity and clarity to describe any pair of orthogonal linear polarizations.

By alternating the polarizations of the optical filters for each adjacent column of pixel units, the first and second views of a 3D object may be interleaved across the image sensor. For example, if the left view is polarized along horizontal polarization and the right view is polarized along vertical polarization, the captured left and right images will be interleaved column by column.

Figure 5:
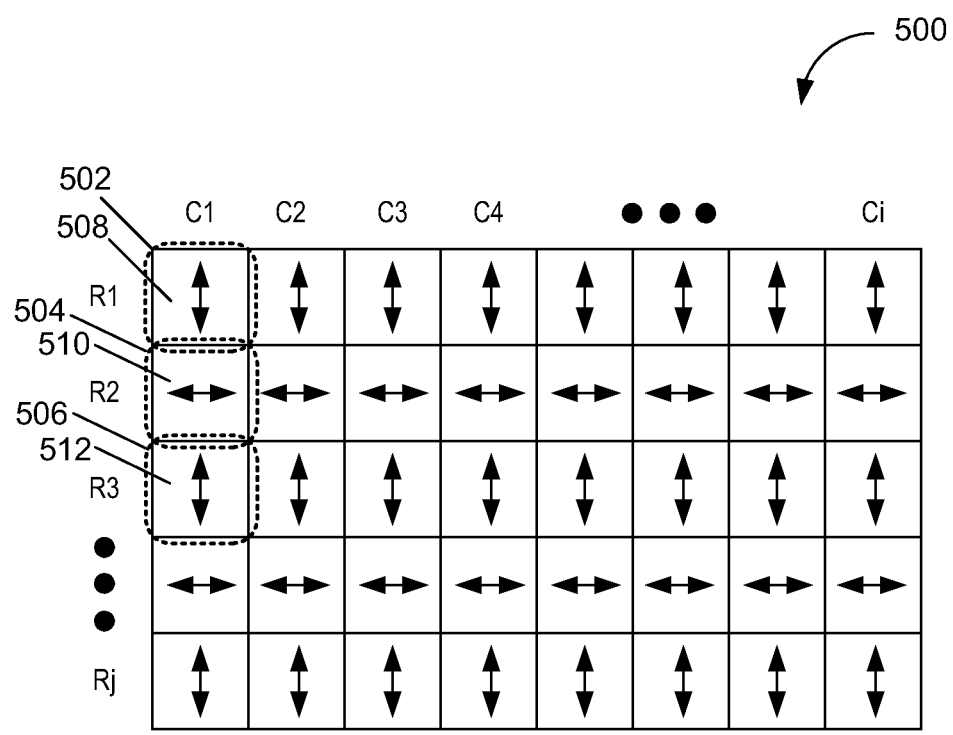
FIG. 5 is a diagram of an array of pixel units having optical filters with alternating polarizations each adjacent row, in accordance with an embodiment of the invention.

FIG. 5 is a diagram of an array 500 of pixel units (e.g., pixel units 502, 504, and 506) having respective optical filters (e.g., 508, 510, and 512) with alternating polarizations each adjacent row, in accordance with an embodiment of the invention. Array 400 is one possible implementation of array 300 of FIG. 3.

The optical filters may cover an entire pixel unit (e.g., all four imaging pixels of a Bayer pattern, as shown in FIG. 3). In the illustrated example, the polarizations of the optical filters alternate each adjacent row. Thus, all optical filters in row R1 may have the same polarization, such as a vertical polarization. Similarly, all optical filters in row R3 may have the same polarization as in row R1. However, the optical filters of row R2 may have a different polarization than those in rows R1 and R3. In one embodiment, the polarization of the optical filters in row R2 is orthogonal to that of the optical filters in both rows R1 and R3.

By way of example, FIG. 5 illustrates pixel units 502, 504 and 506 as all disposed in the same column C1 of array 500. Pixel unit 502 adjoins a top-side of pixel unit 504 and pixel unit 506 adjoins a bottom-side of pixel unit 504, such that pixel unit 504 is between pixel units 502 and 506. Optical filters 508 and 512, included in pixel units 502 and 506 respectively, both include the same polarization, such as vertical polarization. However, optical filter 510 included in the in-between pixel unit 504 has a polarization that is different than that of the optical filters to the top and bottom. In one embodiment, the polarization of optical filter 510 is orthogonal to that of optical filters 508 and 512.

By alternating the polarizations of the optical filters for each adjacent row of pixel units, the first and second views of a 3D object may be interleaved across the image sensor. For example, if the left view is polarized along horizontal polarization and the right view is polarized along vertical polarization, the captured left and right images will be interleaved row by row.

Figure 6:
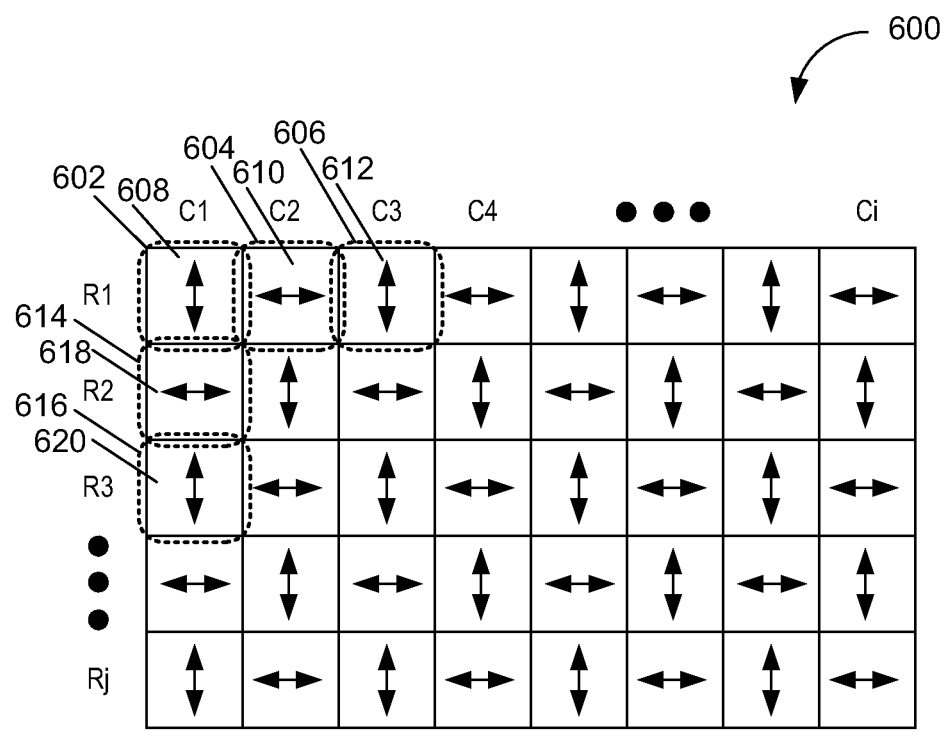
FIG. 6 is a diagram of an array of pixel units having optical filters with polarizations arranged into a checkerboard pattern, in accordance with an embodiment of the invention.
Figure 7:
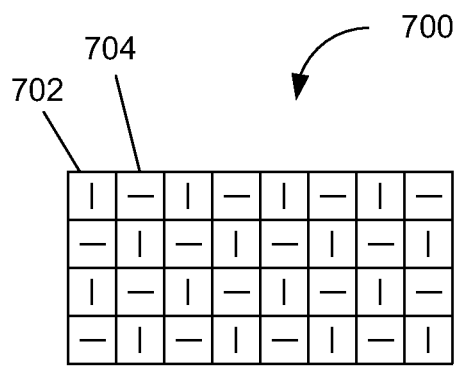
FIGS. 7A-7F illustrate an array of pixel units having optical filters with polarizations arranged into a checkerboard pattern, where each pixel unit includes a single imaging pixel, in accordance with an embodiment of the invention.
Figure 7:
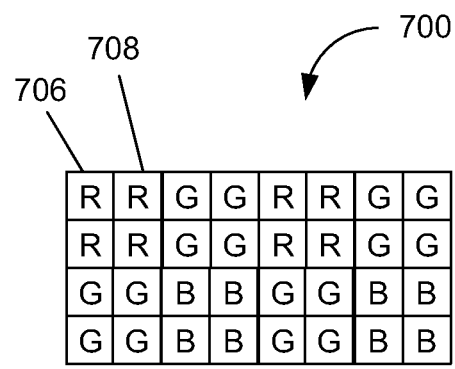
Figure 7:
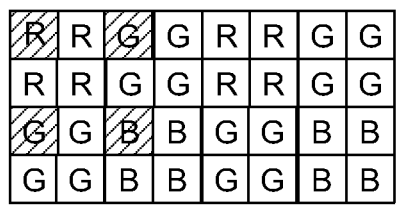
Figure 7:
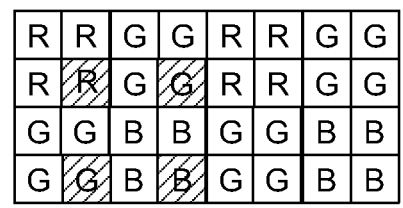
Figure 7:
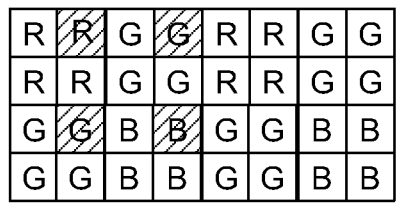
Figure 7:
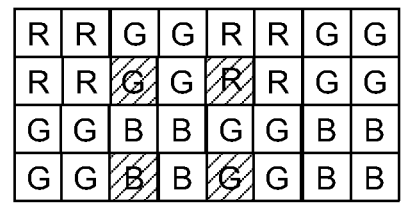

FIG. 6 is a diagram of an array 600 of pixel units (e.g., 602, 604, 604, 614, and 616) having respective optical filters (e.g., optical filters 608, 610, 612, 618, and 620) with polarizations arranged into a checkerboard pattern, in accordance with an embodiment of the invention. Array 600 is one possible implementation of array 300 of FIG. 3.

The optical filters may cover an entire pixel unit (e.g., all four imaging pixels of a Bayer pattern, as shown in FIG. 3). In the illustrated example, the polarizations of the optical filters alternate each adjacent row and each adjacent column. Thus, each optical filter may have a polarization that is different from those of it's adjacent optical filters.

By way of example, FIG. 6 illustrates pixel units 602, 604 and 606 as all disposed in the same row R1 of array 600. Pixel unit 602 adjoins a left-side of pixel unit 604 and pixel unit 606 adjoins a right-side of pixel unit 604, such that pixel unit 604 is between pixel units 602 and 606. Optical filters 608 and 612, included in pixel units 602 and 606 respectively, both include the same polarization, such as vertical polarization. However, optical filter 610 included in the in-between pixel unit 604 has a polarization that is different than that of the adjacent optical filters to the left and right. In one embodiment, the polarization of optical filter 610 is orthogonal to that of optical filters 608 and 612.

Similarly, pixel units 602, 614, and 616 are all disposed in the same column C1 of array 600. Pixel unit 602 adjoins a top-side of pixel unit 614 and pixel unit 616 adjoins a bottom-side of pixel unit 614, such that pixel unit 614 is between pixel units 602 and 616. Optical filters 608 and 620, included in pixel units 602 and 616 respectively, both include the same polarization, such as vertical polarization. However, optical filter 618 included in the in-between pixel unit 614 has a polarization that is different than that of the optical filters to the top and bottom. In one embodiment, the polarization of optical filter 618 is orthogonal to that of optical filters 608 and 620.

By alternating the polarizations of the optical filters for each adjacent row and for each adjacent column of pixel units, the first and second views of a 3D object may be interleaved across the image sensor. For example, if the left view is polarized along horizontal polarization and the right view is polarized along vertical polarization, the captured left and right images will be interleaved in a checkerboard pattern corresponding with the rows and columns of the pixel units.

FIGS. 7A-7F illustrate an array 700 of pixel units (e.g., pixel units 702 and 704) having optical filters with polarizations arranged into a checkerboard pattern, where each pixel unit includes a single imaging pixel, in accordance with an embodiment of the invention. Array 700 is one possible implementation of array 300 of FIG. 3.

Array 700 is similar to that of array 600 of FIG. 6 in that the polarizations of the optical filters are arranged into a checkerboard pattern corresponding with the row and columns of the pixel units. Also, the optical filters of array 700 may cover an entire pixel unit. However, the pixel units in array 700 include a single imaging pixel. In other words, pixel units of array 700 may include no more than one imaging pixel, in accordance with this embodiment. Thus, the rows and columns of the pixel units correspond directly with the rows and columns of the pixel array. In the illustrated example, the polarizations of the optical filters alternate each adjacent row and each adjacent column. Thus, each optical filter for each pixel unit (i.e., imaging pixel) may have a polarization that is different from those of it's adjacent optical filters.

FIG. 7(a) shows an embodiment of array 700 of pixel units 702 and 704 having alternate polarization of optical filters, while FIG. 7(b) illustrates an active area of the image sensor including imaging pixels 706 and 708. As can be seen, pixel unit 702 includes imaging pixel 706 and no other imaging pixels, while pixel unit 704 includes imaging pixel 708 and no others. The number of imaging pixels included array 700 is typically on the order of thousands, but can be hundreds or any numbers. The active area of the imaging pixel shown in array 700 includes color pixels denoted as red (R), green (G), and blue (B) pixels.

If the left view is polarized along horizontal polarization and the right view is polarized along vertical polarization, the captured left and right images are sampled by array 700 and interleaved accordingly. For example, FIG. 7(c) shows that one R pixel, one B pixel, and two G pixels (i.e., indicated in FIG. 7(c) by shading) are sampled by imaging pixels having a vertically polarized optical filter and may form a Bayer unit of the captured right image. Similarly, FIG. 7(d) shows that another set of color pixels (i.e., also indicate in FIG. 7(d) by shading) that are sampled by imaging pixels having a vertically polarized optical filter and may form another Bayer unit of the captured right image.

FIG. 7(e) shows that one R pixel, one B pixel, and two G pixels (i.e., indicated in FIG. 7(e) by shading) sampled by imaging pixels having a horizontally polarized optical filter and may form a Bayer unit of the captured left image. FIG. 7(f) shows that another set of color imaging pixels (i.e., indicated in FIG. 7(f) by shading) that are sampled by imaging pixels having a horizontally polarized optical filter and may form another Bayer unit of the captured left image.

By alternating the polarizations of the optical filters for each adjacent row and for each adjacent column of pixel units, the first and second views of a 3D object may be interleaved across the image sensor. For example, if the left view is polarized along horizontal polarization and the right view is polarized along vertical polarization, the captured left and right images will be interleaved in a checkerboard pattern corresponding with the rows and columns of the pixel units. It is thus appreciated that the array of optical filters of alternating polarization may be arranged in any desired pattern. When the left view is polarized along a first polarization and the right view is polarized along a second polarization, the captured left and right images are sampled by the array of imaging pixels and interleaved according to the pattern of polarization of the corresponding optical filters.

Figure 8:
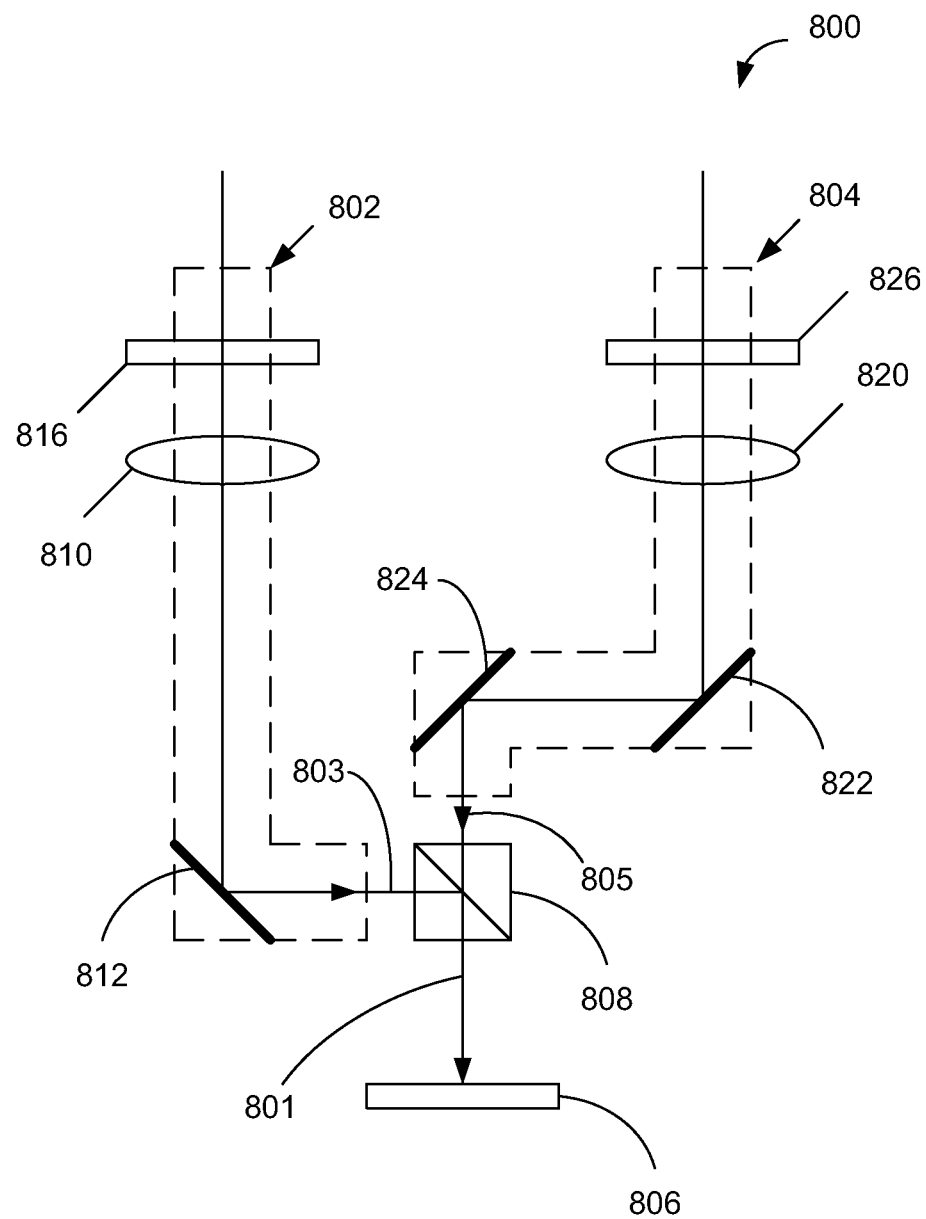
FIG. 8 is a functional block diagram of an imaging system, in accordance with an embodiment of the invention.

FIG. 8 is a functional block diagram of an imaging system 800, in accordance with an embodiment of the invention. Imaging system 800 is illustrated as including a first channel 802, a second channel 804, a beam splitter 808, and an image sensor 806. First channel 802 is illustrated as including a lens 810, a reflector 812 and an optional polarizer 816. Second channel 804 is illustrated as including a lens 820, reflectors 822 and 824, and an optional polarizer 826. Image sensor 806 may be an image sensor having any of the above-described arrays, including pixel array 105 of FIG. 1, array 300 of FIG. 3, array 400 of FIG. 4, array 500 of FIG. 5, array 600 of FIG. 6, or array 700 of FIG. 7.

In the illustrated example, first channel 802 is configured to generate a first view 803 of a 3D object. In one embodiment, first view 803 may be a "left view" of the object. Second channel 804 may be configured to generate a second view 805 of the 3D object. By way of example, the second view 805 may be a "right view" of the object. When displayed together the first and second views 803 and 805 may allow for the creation of a parallax of the object being imaged.

As shown in FIG. 8, the first and second views 803 and 805 are combined by a beam splitter 808 to generate a polarization-encoded light 801. Polarization-encoded light 801 has light of a first polarization corresponding to first view 803 and also includes light of a second polarization corresponding to the second view 805.

In one embodiment, optional polarizers 816 and 826 are not included, such that first and second views 803 and 805 are non-polarized views of the object being imaged. In this embodiment, beam splitter 808 is a polarizing beam splitter configured to combine and polarized first and second views 803 and 805. For example, beam splitter 808 may polarize first view 803 with a first polarization and may also polarize second view 805 with a second polarization. Beam splitter 808 may then combine the polarized first and second views to generate the polarization-encoded light 801.

In another embodiment, beam splitter 808 is a non-polarizing beam splitter and optional polarizers 816 and 826 are included in their respective channels. Polarizer 816 is then configured to polarize the first view with a first polarization, while polarizer 826 is configured to polarize the second view with a second polarization. Non-polarizing beam splitter 808 then combines the polarized first and second views, 803 and 805, to generate the polarization-encoded light 801. Although the polarizers 816 and 826 are illustrated on a light incident-side of the imaging lenses 810 and 820, the polarizers can be disposed at any position along the optical path of their respective channel before reaching non-polarizing beam splitter 808.

In one example, first view 803 is a "left view" of the object being imaged and is horizontally polarized by polarizing beam splitter 808. Similarly, second view 805 may be a "right view" of the object and is vertically polarized by polarizing beam splitter 808. In this way, imaging pixels of image sensor 806 that include optical filters of horizontal polarization capture a left image of the object, while imaging pixels that include optical filters of vertical polarization capture a right image of the object.

Figure 9:
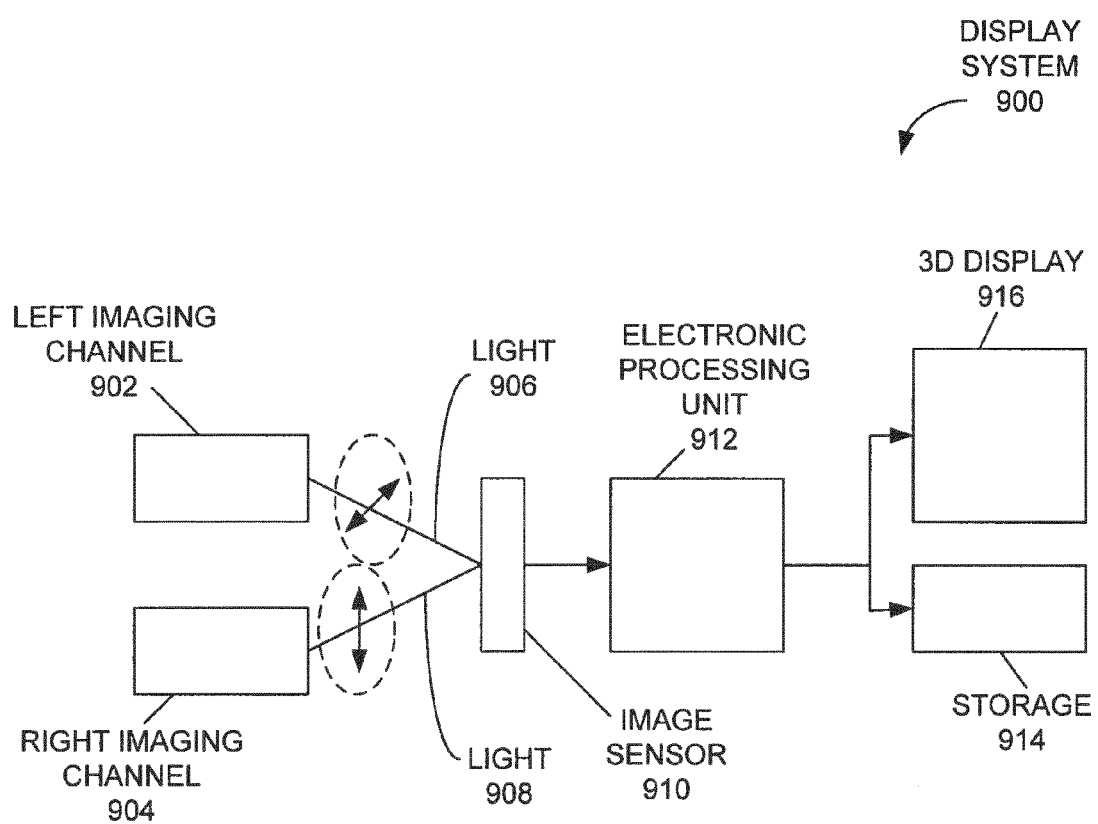
FIG. 9 is a functional block diagram of an imaging and display system, in accordance with an embodiment of the invention.

FIG. 9 is a functional block diagram of an imaging and display system 900, in accordance with an embodiment of the invention. Imaging and display system 900 is illustrated as including a left imaging channel 902, a right imaging channel 904, an image sensor 910, an electronic processing unit 912, storage 914, and a 3D display 916. Left and right imaging channels 902 and 904 may include imaging channels 802 and 804 described with reference to FIG. 8. Similarly, image sensor 910 may be an image sensor having any of the above-described arrays, including pixel array 105 of FIG. 1, array 300 of FIG. 3, array 400 of FIG. 4, array 500 of FIG. 5, array 600 of FIG. 6, or array 700 of FIG. 7.

FIG. 9 illustrates light 906, including a "left view" of an object, generated by left imaging channel 902 and polarized in a first direction, e.g., horizontal polarization. FIG. 9 also illustrates light 908, including a "right view" of the object, generated by right imaging channel 904 and polarized in a second direction which is orthogonal to the first direction (e.g., vertical polarization). The images formed by left imaging channel 902 and right imaging channel 904 are captured by an image sensor 910 having an array of optical filters of alternating orthogonal polarizations in the same first and second directions. The left and right images are sampled by imaging pixels and are interleaved across the active area of the image sensor. Image sensor 910 is read out by electronic processing unit 912. In one embodiment, electronic processing unit is an application specific integrated circuit ("ASIC") or the like. In electronic processing unit 912, the left and right images are separated, processed as necessary, and combined in a format suitable for storage in a storage 914 or suitable for display by 3D display 916. Storage 914 may include any mechanism that provides (i.e., stores and/or transmits) information in a form accessible by a machine. For example, a storage 914 includes recordable media (e.g., random access memory (RAM), magnetic disk storage media, optical storage media, flash memory devices, etc.).

Additionally, 3D display 916 may include any device that displays (e.g., outputs, projects, emits, presents, etc.) a parallax of the object imaged by image sensor 910. For example, 3D display 916 may be an LCD display, a stereoscopic display, a projector, a lenticular printer, etc.

Figure 10:
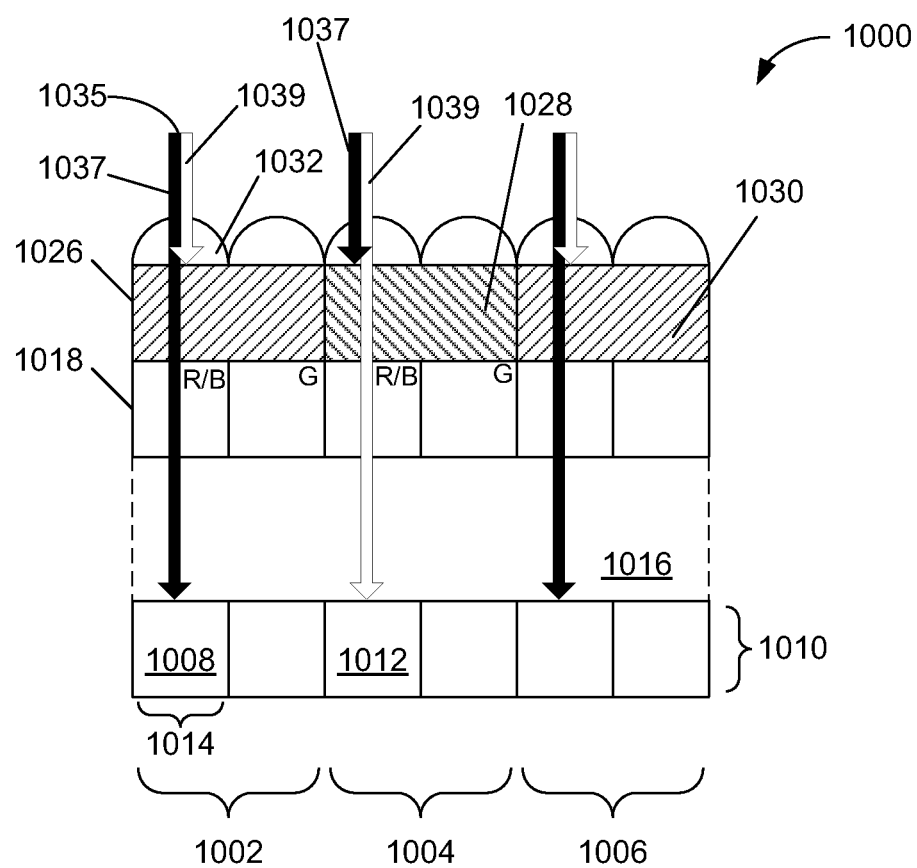
FIG. 10 is a cross-sectional view of portion of an image sensor, in accordance with an embodiment of the invention.

FIG. 10 is a cross-sectional view of portion of an image sensor 1000, in accordance with an embodiment of the invention. Image sensor 1000 is one possible implementation of any of the above-described image sensors including image sensor 100 of FIG. 1, image sensor 806 of FIG. 8, and image sensor 910 of FIG. 9. Image sensor 1000 is illustrated as including pixel units 1002, 1004, and 1006. FIG. 10 illustrates pixel unit 1002 as having several imaging pixels including imaging pixel 1014. Imaging pixel 1014 includes a photosensing region 1008, a color filter 1018, and a microlens 1032. Also shown in FIG. 10 are semiconductor layer 1010, optical filters 1026, 1028, and 1030, and polarization-encoded light 1035. Polarization-encoded light 1035 is shown as including light 1037 having a first polarization and light 1039 having a second polarization.

FIG. 10 illustrates photosensing region 1008 of imaging pixel 1014 as being disposed in semiconductor layer 1010. In one embodiment, photosensing region 1008 includes a photodiode and may be arranged in the 4T pixel architecture, such as in pixel circuitry 200 of FIG. 2. Furthermore, imaging pixel 1014 may be a complementary metal-oxide-semiconductor ("CMOS") imaging pixel.

Disposed on semiconductor layer 1010 is a layer (or combination of layers) 1016. Layer(s) 1016 may include one or more metal layers for routing electrical signals between imaging pixel 1014 and readout or control circuitry disposed on a periphery area (not shown) of image sensor 1000. By way of example, periphery circuitry of image sensor 1000 may include readout circuitry 110, function logic 115, and control circuitry 120 of FIG. 1. Imaging pixel 1014 is also shown as including color filter 1018 disposed on layer(s) 1016. In the illustrated example, color filter 1018 may be either a red or a blue color filter, such that color imaging pixels of pixel unit 1002 form a desired color pattern, such as a Bayer pattern. Imaging pixel 1014 also includes microlens 1032 disposed on the light-incident side of image sensor 1000 for focusing light to photosensing region 1008.

Also shown in FIG. 10 is optical filter 1026. In the illustrated example, optical filter 1026 is disposed between the color filter and microlens of each imaging pixel included in pixel unit 1002. However, it is recognized that optical filter 1026 may be disposed at any position along the optical path between microlens 1032 and photosensing region 1008. Optical filter 1026 has a first polarization, while optical filter 1028 in adjacent pixel unit 1004 has a second polarization. The polarization of optical filter 1026 is different than the polarization of optical filter 1028. For example, optical filter 1026 may have a polarization that is orthogonal to that of the polarization of optical filter 1028. In the illustrated example, optical filter 1026 may be horizontally polarized, while optical filter 1028 is vertically polarized. Similarly, optical filter 1030 has a polarization that is the same as the polarization of optical filter 1026. Thus, optical filter 1030 may also be horizontally polarized.

In operation, polarization-encoded light 1035 is received at a light incident side of image sensor 1000. The polarization-encoded light 1035 includes light 1037 that horizontally polarized and light 1039 that is vertically polarized. In one embodiment, light 1037 corresponds with a "left view" of a 3D object, while light 1039 corresponds with a "right view" of the 3D object, such that image sensor 1000 may form a parallax image of the object. Since optical filter 1026 has a horizontal polarization, optical filter 1026 transmits (i.e., passes through) the horizontally polarized light 1037 of the polarization-encoded light 1035, but blocks (i.e., absorbs) the vertically polarized light 1039. Similarly, optical filter 1028 of the adjacent pixel unit 1004 transmits the vertically polarized light 1039 and blocks the horizontally polarized light 1037. Thus, photosensing region 1008 may capture a portion of left image of the object, while photosensing region 1012 may capture a portion of the right image of the object.

In one embodiment, optical filter 1026 is made from polyvinyl alcohol (PVA) impregnated with iodine. During manufacture of the optical filters, the PVA polymer chains may be stretched such that they form an array of aligned, linear molecules in the material. The iodine dopant attaches to the PVA molecules and makes them conducting along the length of the chains. Light polarized parallel to the chains is absorbed, and light polarized perpendicular to the chains is transmitted. For embodiments described above, a polarized optical filter may be formed on the image sensor during the manufacture of image sensor using a standard lithographic process. The iodine crystals in the polarizer array may be aligned by applying electric or magnetic fields during the formation of horizontal and vertical polarized optical filters, respectively. With the crystals aligned and fixed, the optical filter may absorb light which is polarized parallel to the direction of the crystal alignment, and transmit light which is polarized perpendicular to it. In another embodiment, the optical filters may be cut from polarizer sheets and pasted onto the image sensor.

Figure 11:
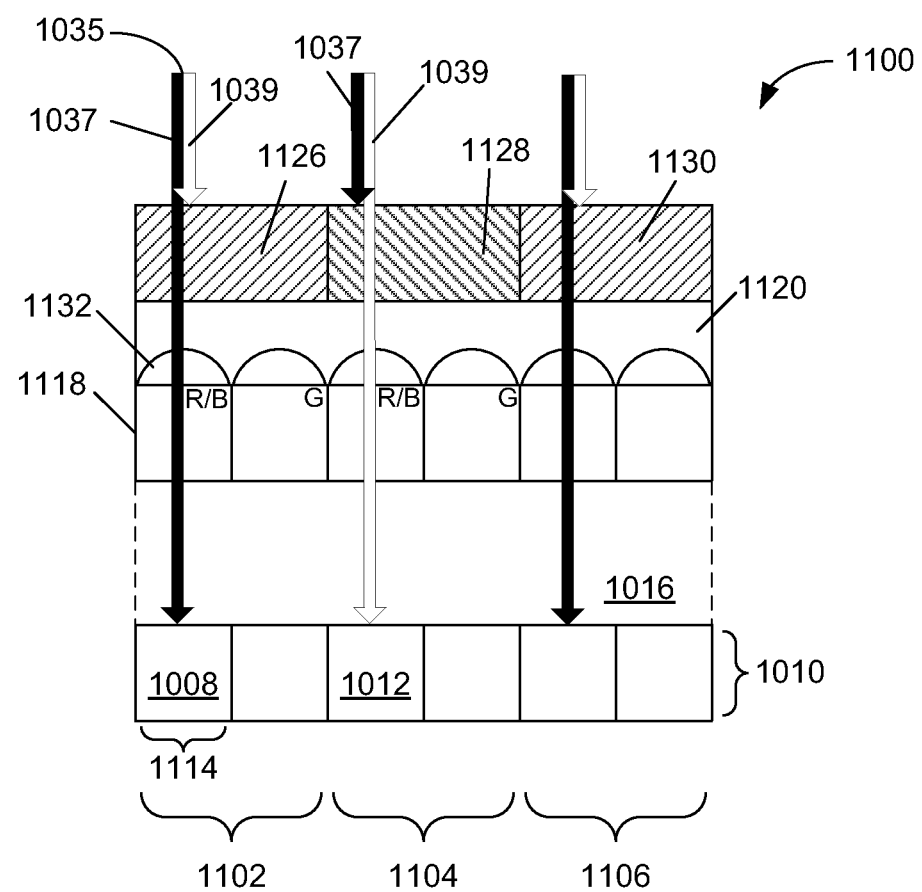
FIG. 11 is a cross-sectional view of a portion of another image sensor, in accordance with an embodiment of the invention.

FIG. 11 is a cross-sectional view of a portion of another image sensor 1100, in accordance with an embodiment of the invention. Image sensor 1100 is one possible implementation of any of the above-described image sensors including image sensor 100 of FIG. 1, image sensor 806 of FIG. 8, and image sensor 910 of FIG. 9. Image sensor 1100 is illustrated as including pixel units 1102, 1104, and 1106. FIG. 11 illustrates pixel unit 1102 as having several imaging pixels including imaging pixel 1114. Imaging pixel 1114 includes photosensing region 1008, a color filter 1118, and a microlens 1132. Also shown in FIG. 11 are semiconductor layer 1010, optical filters 1126, 1128, and 1130, and polarization-encoded light 1035.

Image sensor 1100 is similar to image sensor 1000 of FIG. 10, except optical filters 1126, 1128, and 1130 are disposed above the microlenses. In addition, image sensor 1100 includes a transparent planarization layer 1120 that is disposed on the microlenses (e.g., microlens 1132), where the optical filters may then be formed on planarization layer 1120. Thus, in the example of FIG. 11, microlens 1132 of imaging pixel 1114 is disposed between optical filter 1126 and photosensing region 1114.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
    a beamsplitter to encode incident light with a set of two orthogonal polarizations including a first polarization and a second polarization, wherein the incident light includes light polarized to the first polarization corresponding to a first view of a three-dimensional object and light polarized to the second polarization corresponding to a second view of the three-dimensional object;
    a pixel array comprising a plurality of pixel units arranged in rows and columns, each pixel unit including at least one imaging pixel;
    a polarizer array optically coupled to the pixel array to filter the incident light, the polarizer array comprising a plurality of polarizing filters wherein each pixel unit in the pixel array is optically coupled to a corresponding polarizing filter in the polarizer array, and wherein the polarizations of all polarizing filters in the polarizer array are selected from the set of two orthogonal polarizations consisting of the first polarization and the second polarization;
    wherein each imaging pixel comprises:
        a photosensing region disposed in a semiconductor layer of the image sensor;
        a color filter disposed on the light-incident side of the image sensor; and
        a microlens disposed on the light incident side to focus incident light to the photosensing region.

2. The image sensor of claim 1 wherein the polarizations of the polarizing filters in every row and every column of the polarizer array alternate between the first polarization and the second polarization.

3. The image sensor of claim 1 wherein rows in the polarizing array alternate between rows in which all polarizing filters have the first polarization and rows in which all polarizing filters have the second polarization.

4. The image sensor of claim 1 wherein columns in the polarizing array alternate between columns in which all polarizing filters have the first polarization and columns in which all polarizing filters have the second polarization.

5. The image sensor of claim 1 wherein the polarizing filter corresponding to each imaging pixel is disposed between the color filter and the microlens.

6. The image sensor of claim 1 wherein the color filter is part of a color filter array in which the color filters are arranged in a Bayer pattern.

7. The image sensor of claim 1 wherein each imaging pixel further comprises a planarization layer disposed on the microlens, and wherein the polarizing filter corresponding to each imaging pixel is disposed on the planarization layer.

8. The image sensor of claim 1 wherein the image sensor is a complementary metal-oxide-semiconductor ("CMOS") image sensor.

9. An imaging system for three-dimensional ("3D") imaging, the system comprising:
   a first channel for generating a first view of a 3D object;
   a second channel for generating a second view of the 3D object;
   a beam splitter coupled to the first and second channels to combine the first and second views to output polarization-encoded light having a first polarization corresponding to the first view of the 3D object and a second polarization corresponding to the second view of the 3D object; and
   an image sensor coupled to receive the polarization-encoded light, the image sensor including:
      a pixel array comprising a plurality of pixel units arranged in rows and columns, each pixel unit including four imaging pixels arranged into a Bayer pattern; and
      a polarizer array optically coupled to the pixel array to filter the polarization-encoded light, the polarizer array comprising a plurality of polarizing filters wherein each pixel unit in the pixel array is optically coupled to a corresponding polarizing filter in the polarizer array, and wherein the polarizations of all polarizing filters in the polarizer array are selected from a set of two orthogonal polarizations consisting of the first polarization and the second polarization;
   wherein each imaging pixel comprises:
      a photosensing region disposed in a semiconductor layer of the image sensor;
      a color filter disposed on the light-incident side of the image sensor; and
      a microlens disposed on the light incident side to focus incident light to the photosensing region.

10. The imaging system of claim 9 wherein the first and second channels generate non-polarized views of the 3D object and wherein the beam splitter is a polarizing beam splitter configured to combine and polarize the first and second views with the first and second polarizations, respectively, to generate the polarization-encoded light.

11. The imaging system of claim 9 wherein the first channel includes a first polarizer coupled to polarize the first view of the 3D object with the first polarization, the second channel includes a second polarizer coupled to polarize the second view with the second polarization, and wherein the beam splitter is a non-polarizing beam splitter.

12. The imaging system of claim 9 wherein the polarizations of the polarizing filters in every row and every column of the polarizer array alternate between the first polarization and the second polarization.

13. The imaging system of claim 9 wherein rows in the polarizing array alternate between rows in which all polarizing filters have the first polarization and rows in which all polarizing filters have the second polarization.

14. The imaging system of claim 9 wherein columns in the polarizing array alternate between columns in which all polarizing filters have the first polarization and columns in which all polarizing filters have the second polarization.

15. The imaging system of claim 9 wherein the polarization-encoded light includes light polarized to the first polarization corresponding to a first view of a three-dimensional object and light polarized to the second polarization corresponding to a second view of the three-dimensional object.

16. The imaging system of claim 9 wherein the polarizing filter corresponding to each imaging pixel is disposed between the color filter and the microlens.

17. The imaging system of claim 9 wherein each imaging pixel further comprises a planarization layer disposed on the microlens, and wherein the polarizing filter corresponding to each imaging pixel is disposed on the planarization layer.

18. The imaging system of claim 9 wherein the image sensor is a complementary metal-oxide-semiconductor ("CMOS") image sensor.

* * * * *